United States Patent
Kawai et al.

(10) Patent No.: US 11,291,118 B2
(45) Date of Patent: Mar. 29, 2022

(54) INDUCTOR BUILT-IN SUBSTRATE

(71) Applicant: IBIDEN CO., LTD., Gifu (JP)

(72) Inventors: Satoru Kawai, Ogaki (JP); Yasuki Kimishima, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 0 days.

(21) Appl. No.: 17/184,865

(22) Filed: Feb. 25, 2021

(65) Prior Publication Data
US 2021/0298178 A1 Sep. 23, 2021

(30) Foreign Application Priority Data
Mar. 18, 2020 (JP) .............................. JP2020-047584

(51) Int. Cl.
*H05K 1/18* (2006.01)
*H05K 1/03* (2006.01)

(52) U.S. Cl.
CPC .......... *H05K 1/185* (2013.01); *H05K 1/0306* (2013.01); *H05K 2201/09563* (2013.01); *H05K 2201/1003* (2013.01)

(58) Field of Classification Search
CPC ................. H05K 1/185; H05K 1/0306; H05K 2201/09563; H05K 2201/1003

USPC ......................................................... 174/258
See application file for complete search history.

(56) References Cited

U.S. PATENT DOCUMENTS

| | | | | |
|---|---|---|---|---|
| 2014/0034373 | A1* | 2/2014 | Yoshikawa | H05K 1/165 174/260 |
| 2017/0256497 | A1* | 9/2017 | Mano | H05K 1/183 |
| 2019/0274217 | A1* | 9/2019 | Zhang | H05K 1/165 |
| 2020/0091053 | A1* | 3/2020 | Paital | H01F 17/04 |
| 2021/0104475 | A1* | 4/2021 | Radhakrishnan | H01F 41/12 |

FOREIGN PATENT DOCUMENTS

JP 2016-197624 A 11/2016

* cited by examiner

*Primary Examiner* — Sherman Ng
(74) *Attorney, Agent, or Firm* — Oblon, McClelland, Maier & Neustadt, L.L.P.

(57) ABSTRACT

An inductor built-in substrate includes a core substrate having an opening and a first through hole formed therein, a magnetic resin filling the opening and having a second through hole formed therein, a first through-hole conductor including a metal film formed in the first through hole, and a second through-hole conductor including a metal film formed in the second through hole. The core substrate and the magnetic resin are formed such that a surface in the first through hole has a roughness that is larger than a roughness of a surface in the second through hole.

20 Claims, 4 Drawing Sheets

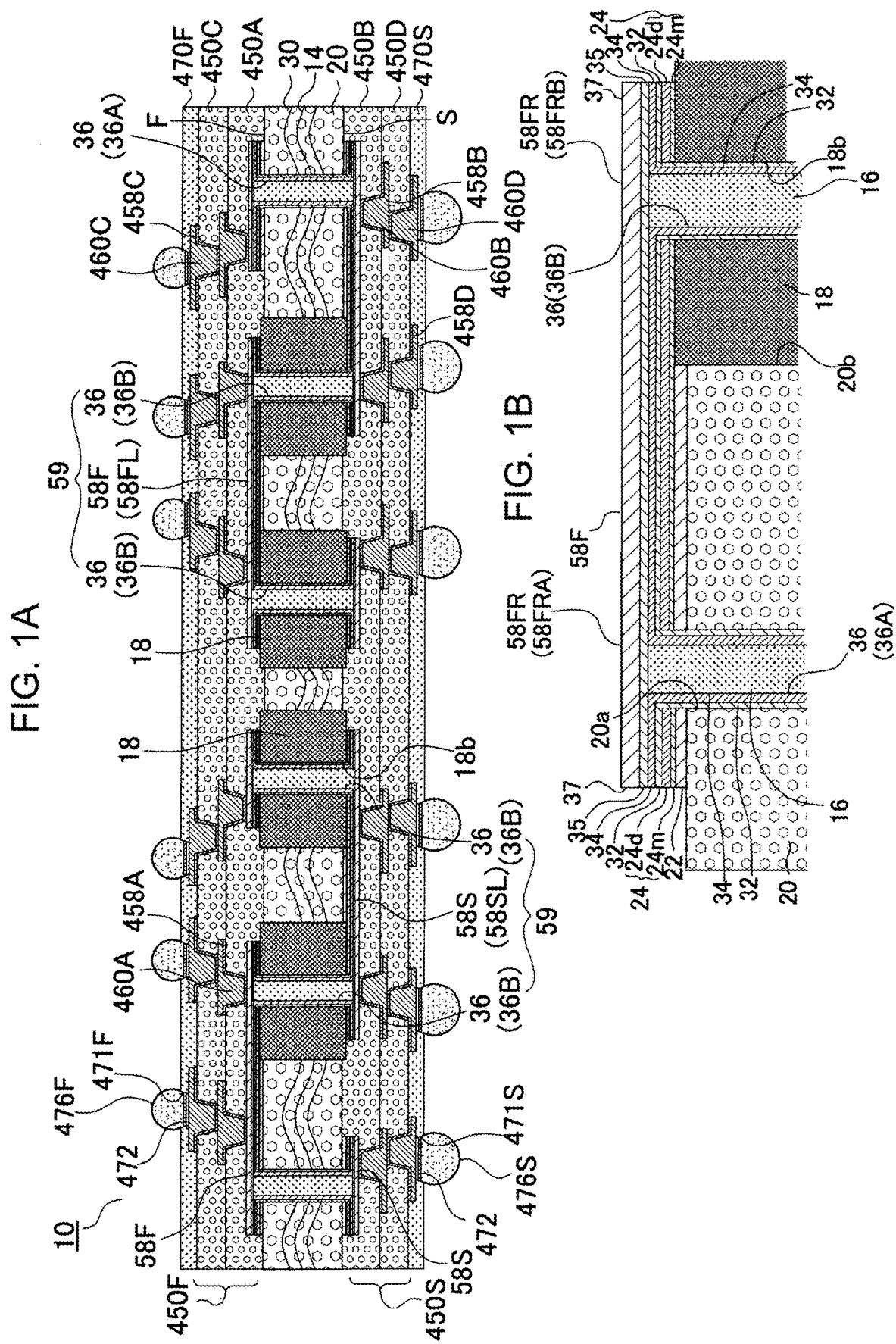

INDUCTOR BUILT-IN SUBSTRATE

CROSS-REFERENCE TO RELATED APPLICATIONS

The present application is based upon and claims the benefit of priority to Japanese Patent Application No. 2020-047584, filed Mar. 18, 2020, the entire contents of which are incorporated herein by reference.

BACKGROUND OF THE INVENTION

Field of the Invention

The present invention relates to an inductor built-in substrate that has an inductor built therein.

Description of Background Art

Japanese Patent Application Laid-Open Publication No. 2016-197624 describes a method for manufacturing an inductor component built in a wiring substrate. In Japanese Patent Application Laid-Open Publication No. 2016-197624, a magnetic material is accommodated inside a resin layer, through-hole conductors are provided in the resin layer, and the through-hole conductors are prevented from being in contact with the magnetic material. The entire contents of this publication are incorporated herein by reference.

SUMMARY OF THE INVENTION

According to one aspect of the present invention, an inductor built-in substrate includes a core substrate having an opening and a first through hole formed therein, a magnetic resin filling the opening and having a second through hole formed therein, a first through-hole conductor including a metal film formed in the first through hole, and a second through-hole conductor including a metal film formed in the second through hole. The core substrate and the magnetic resin are formed such that a surface in the first through hole has a roughness that is larger than a roughness of a surface in the second through hole.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 1A is a cross-sectional view of an inductor built-in substrate of an embodiment of the present invention;

FIG. 1B is an enlarged view of a core substrate of the inductor built-in substrate;

DETAILED DESCRIPTION OF THE EMBODIMENTS

Figure 2A:
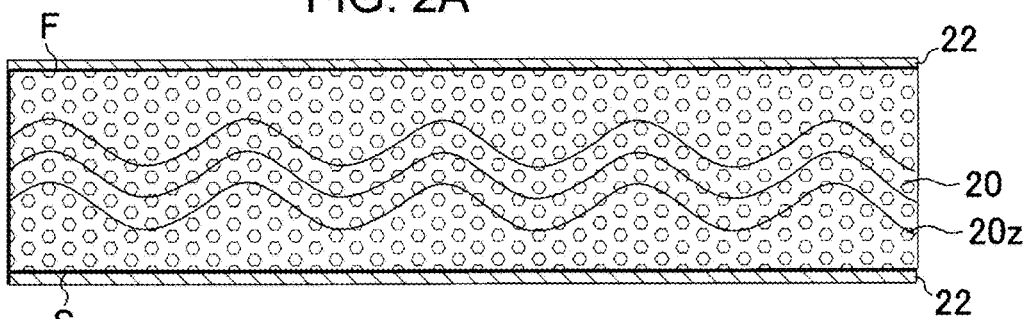
FIGS. 2A-2E are process diagrams illustrating a method for manufacturing an inductor built-in substrate according to an embodiment of the present invention.
Figure 2B:
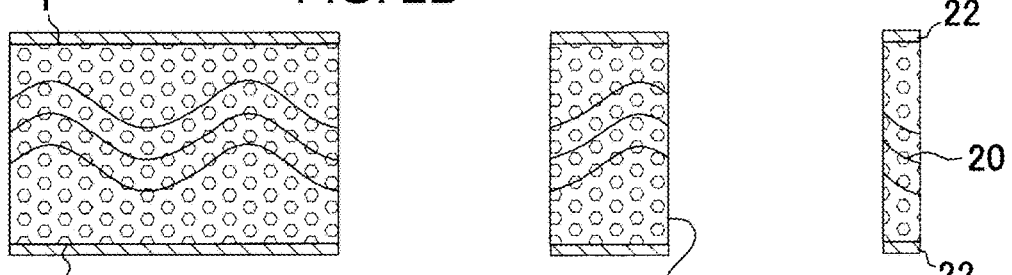
Figure 2C:
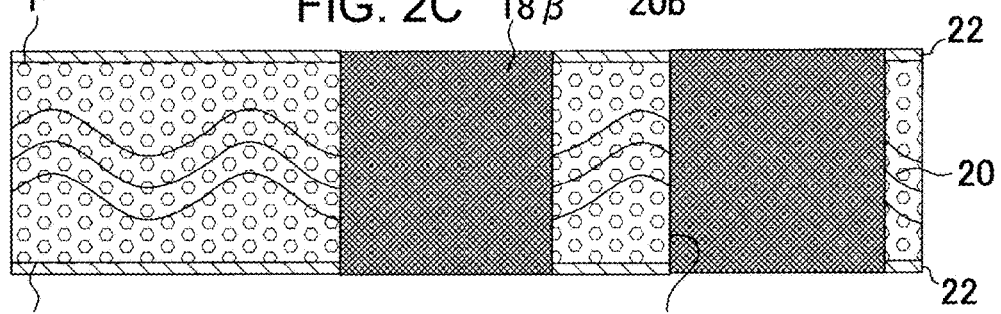

Embodiments will now be described with reference to the accompanying drawings, wherein like reference numerals designate corresponding or identical elements throughout the various drawings.

FIG. 1A illustrates a cross-sectional view of an inductor built-in substrate 10 of an embodiment that has an inductor built therein. The inductor built-in substrate 10 has a core substrate 30 that is formed to include: an insulating base material 20 that has a first surface (F) and a second surface (S) on an opposite side with respect to the first surface (F); a first conductor layer (conductor circuit) (58F) on the first surface (F) of the insulating base material; a second conductor layer (58S) on the second surface (S) of the insulating base material; and through-hole conductors 36 that connect the first conductor layer (58F) and the second conductor layer (58S) to each other. The core substrate 30 has a first surface (F) and a second surface (S) on an opposite side with respect to the first surface (F). The first surface (F) of the core substrate 30 and the first surface (F) of the insulating base material 20 are the same surface, and the second surface (S) of the core substrate 30 and the second surface (S) of the insulating base material 20 are the same surface. The insulating base material 20 is formed of a resin such as an epoxy resin and a core material 14 such as a glass cloth for reinforcement. The insulating base material 20 may further contain inorganic particles such as silica particles.

The inductor built-in substrate 10 further has an upper side build-up layer (450F) formed on the first surface (F) of the core substrate 30. The upper side build-up layer (450F) includes: an insulating layer (450A) formed on the first surface (F) of the core substrate 30; a conductor layer (458A) formed on the insulating layer (450A); and via conductors (460A) penetrating the insulating layer (450A) and connecting the first conductor layer (58F) and the conductor layer (458A) to each other. The upper side build-up layer (450F) further includes: an insulating layer (450C) formed on the insulating layer (450A) and the conductor layer (458A); a conductor layer (458C) formed on the insulating layer (450C); and via conductors (460C) penetrating the insulating layer (450C) and connecting the conductor layer (458A) and the conductor layer (458C) to each other.

The inductor built-in substrate 10 further has a lower side build-up layer (450S) formed on the second surface (S) of the core substrate 30. The lower side build-up layer (450S) includes: an insulating layer (450B) formed on the second surface (S) of the core substrate 30; a conductor layer (458B) formed on the insulating layer (450B); and via conductors (460B) penetrating the insulating layer (450B) and connecting the second conductor layer (58S) and the conductor layer (458B) to each other. The lower side build-up layer (450S) further includes: an insulating layer (450D) formed on the insulating layer (450B) and the conductor layer (458B); a conductor layer (458D) formed on the insulating layer (450D); and via conductors (460D) penetrating the insulating layer (450D) and connecting the conductor layer (458B) and the conductor layer (458D) to each other.

The inductor built-in substrate of the embodiment further includes a solder resist layer (470F) having openings (471F) formed on the upper side build-up layer (450F) and a solder resist layer (470S) having openings (471S) formed on the lower side build-up layer (450S).

Upper surfaces of the conductor layers (458C, 458D) or the via conductors (460C, 460D) exposed from the openings (471F, 471S) of the solder resist layers (470F, 470S) function as pads. A protective film 472 formed of Ni/Au, Ni/Pd/Au, Pd/Au, OSP, or the like is formed on each of the pads. Solder bumps (476F, 476S) are respectively formed on the protective films. An IC chip (not illustrated in the drawings) is mounted on the inductor built-in substrate 10 via the solder bumps (476F) formed on the upper side build-up layer (450F). The inductor built-in substrate 10 is mounted on a motherboard (not illustrated in the drawings) via the solder bumps (476S) formed on the lower side build-up layer (450S).

FIG. 1B illustrates an enlarged view of a portion of the core substrate 30 in FIG. 1A. In the core substrate 30, the through-hole conductors 36 connecting the first conductor layer (58F) and the second conductor layer (58S) to each other include first through-hole conductors (36A) that are respectively formed in first through holes (20a) penetrating the core substrate 30 and second through-hole conductors (36B) that are respectively formed in second through holes (18b) of a magnetic resin 18 filled in openings (20b) of the core substrate 30. A resin filler 16 is filled inside the first through-hole conductors (36A) and the second through-hole conductors (36B), and through-hole lands (58FR) are formed of cover plating. The through-hole lands (58FR) include first through-hole lands (58FRA) respectively formed on the first through-hole conductors (36A) and second through-hole lands (58FRB) respectively formed on the second through-hole conductors (36B).

The magnetic resin 18 contains iron oxide filler (magnetic particles) and a resin such as an epoxy resin. Examples of the magnetic particles include iron oxide fillers such as FeO, $Fe_2O_3$, and $Fe_3O_4$ particles. A content of the iron oxide filler in the magnetic resin is preferably 60% by weight or more. From a point of view that the content of the iron oxide filler can be increased and magnetic permeability and heat conductivity can be increased, particle sizes of the iron oxide filler are desirably non-uniform.

As illustrated in FIG. 1B, the first through-hole conductors (36A) that are respectively formed in the first through holes (20a) penetrating the core substrate 30 are respectively in contact with the first through holes (20a). The first through-hole conductors (36A) are formed of a second electroless plating film 32 on the first through holes (20a), and a second electrolytic plating film 34 on the second electroless plating film 32. The second through-hole conductors (36B) that are respectively formed in the second through holes (18b) penetrating the magnetic resin 18 are respectively in contact with the second through holes (18b). The second through-hole conductors (36B) are formed of a second electroless plating film 32 on the second through holes (18b), and a second electrolytic plating film 34 on the second electroless plating film 32.

An average roughness of surfaces of the first through holes (20a) formed in the insulating base material 20 is 2.3-12.3 μm in terms of a ten-point average roughness (Rz). An average roughness of surfaces of the second through holes (18b) formed in the magnetic resin 18 is 0.1-2.2 μm in terms of a ten-point average roughness (Rz). The surfaces of the second through holes (18b) are formed such that cut end surfaces of the iron oxide filler particles are exposed, and thus have a lower average roughness than the surfaces of the first through holes (20a). Since the core material 14 of the insulating base material 20 is exposed on the surfaces of the first through holes (20a), the roughness of the surfaces of the first through holes (20a) is increased. However, when the iron oxide filler particles falls off from the surfaces of the second through holes (18b), the surfaces of the second through holes (18b) become uneven, and become rougher than the surfaces of the first through holes (20a). Therefore, in the embodiment, the second through holes (18b) are formed such that the iron oxide filler particles do not fall off from the surfaces of the second through holes (18b) and the cut end surfaces of the iron oxide filler particles are exposed. That is, the surface roughness of the first through holes (20a) formed in the core substrate 30 is larger than the surface roughness of the second through holes (18b) formed in the magnetic resin 18. Since the surface roughness of the second through holes is low, surface unevenness of the second through-hole conductors (36B) formed on the surfaces of the second through holes (18b) is reduced, and a power loss in the second through-hole conductors (36B) is reduced. In particular, since high-frequency waves flow through the second through-hole conductors (36B) formed in the magnetic resin 18, as electrical characteristics of the second through-hole conductors (36B) increase, variation in electrical characteristics between the second through-hole conductors (36B) decreases.

The first through-hole lands (58FRA) and the first conductor layer (58F) on the insulating base material 20 are each formed of the copper foil 22 as a lowermost layer, the first electroless plating film (24m) on the copper foil 22, the first electrolytic plating film (24d) on the first electroless plating film (24m), the second electroless plating film 32 on the first electrolytic plating film (24d), the second electrolytic plating film 34 on the second electroless plating film 32, the third electroless plating film 35 on the second electrolytic plating film 34, and the third electrolytic plating film 37 on the third electroless plating film 35. The second through-hole lands (58FRB) and the first conductor layer (58F) on the magnetic resin 18 are each formed of the first electroless plating film (24m) as a lowermost layer, the first electrolytic plating film (24d) on the first electroless plating film (24m), the second electroless plating film 32 on the first electrolytic plating film (24d), the second electrolytic plating film 34 on the second electroless plating film 32, the third electroless plating film 35 on the second electrolytic plating film 34, and the third electrolytic plating film 37 on the third electroless plating film 35. The first electroless plating film (24m) and the first electrolytic plating film (24d) form a shield layer 24.

In the core substrate 30 of the embodiment, the first conductor layer (58F) (connection pattern (58FL)) and the second conductor layer (58S) (connection pattern (58SL)) which are connected to each other via the second through-hole conductors (36B) formed in the magnetic resin 18 illustrated in FIG. 1A are formed in a helical shape (a spiral shape along an axis in a direction parallel to the front and back surfaces of the core substrate), and together with the second through-hole conductors (36B) form an inductor 59.

In the inductor built-in substrate 10 of the embodiment, the first conductor layer (58F) and the second conductor layer (58S) are formed on the surfaces of the core substrate 30, and the second through-hole conductors (36B) connecting the first conductor layer (58F) and the second conductor layer (58S) to each other are directly formed in the second through holes (18b) penetrating the magnetic resin 18. Therefore, a ratio of a magnetic material in the inductor built-in substrate 10 is increased and an inductance can be increased.

Method for Manufacturing Inductor Built-in Substrate

A method for manufacturing an inductor built-in substrate according to an embodiment of the present invention is illustrated in FIGS. 2A-4C. A substrate (20z) is prepared which is formed of a copper-clad laminated plate which is formed by laminating a copper foil 22 on both sides of the insulating base material 20 (FIG. 2A). The openings (20b) for filling the magnetic resin therein are formed in the insulating base material 20 (FIG. 2B). A resin paste containing iron oxide filler (magnetic particles) in an amount of 90% by weight and an epoxy resin is vacuum-printed in the openings (20b). The resin paste is temporarily cured (semi-cured) at a temperature at which a viscosity of the resin paste is 2 or less times that at a normal temperature, and a temporarily cured magnetic resin (18β) is formed (FIG. 2C). When necessary, processed smear may be removed by performing high-pressure water washing or the like in the openings (20b) before filling the magnetic resin.

Figure 2D:
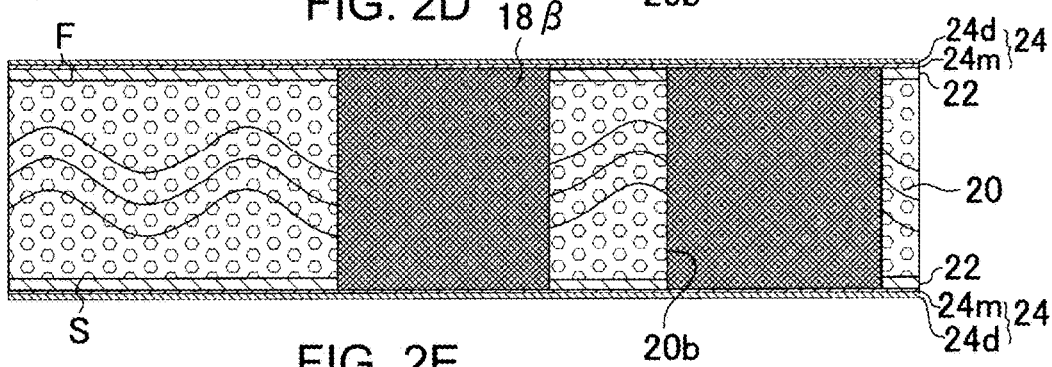

On a surface of the insulating base material 20 and a surface of the temporarily cured magnetic resin (18β) exposed from the openings (20b), a first electroless plating film (24m) is formed by an electroless plating treatment, and a first electrolytic plating film (24d) is formed by an electrolytic plating treatment (FIG. 2D). The first electroless plating film (24m) and the first electrolytic plating film (24d) form a shield layer 24.

Figure 2E:
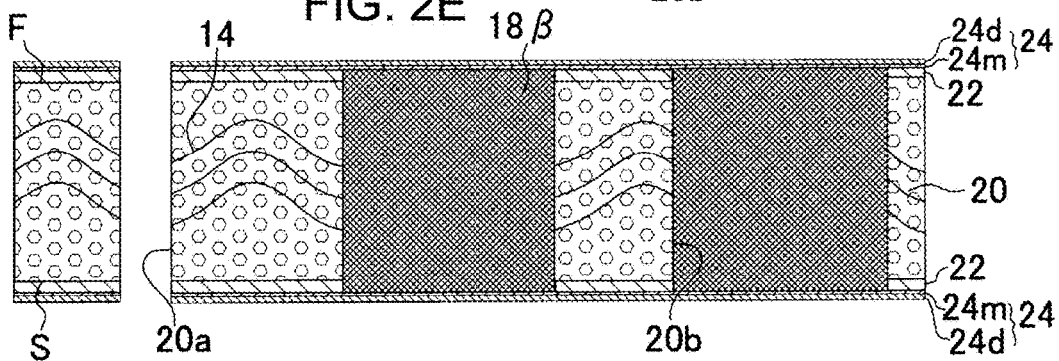

The first through holes (20a) are formed in the insulating base material 20 by mechanical drilling, laser processing, or the like (FIG. 2E). Thereafter, the first through holes (20a) are subjected to a desmear treatment using a chemical solution. During the desmear treatment, the temporarily cured magnetic resin (18β) covered by the shield layer 24 formed by the first electroless plating film (24m) and the first electrolytic plating film (24d) is not affected by the chemical solution. The iron oxide filler on the surface of the temporarily cured magnetic resin (18β) is not affected by the desmear treatment.

Figure 3A:
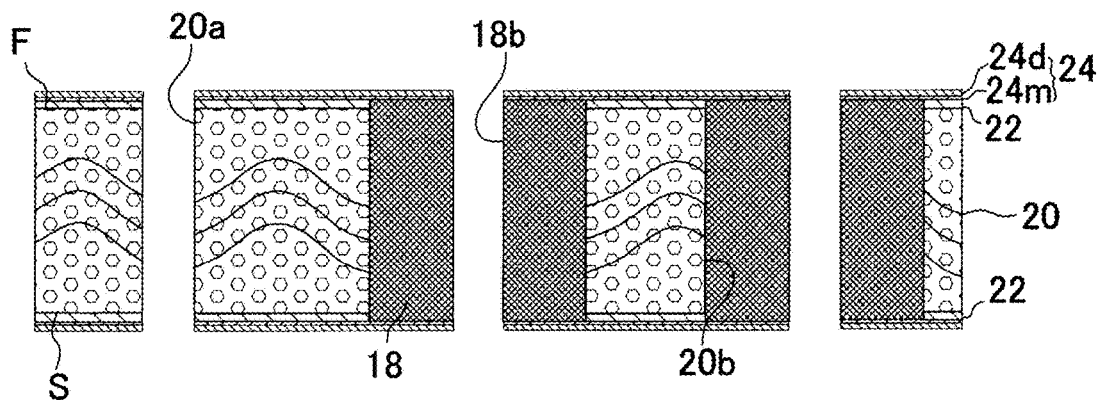
FIGS. 3A-3D are process diagrams illustrating the method for manufacturing an inductor built-in substrate according to the embodiment of the present invention.
Figure 3B:
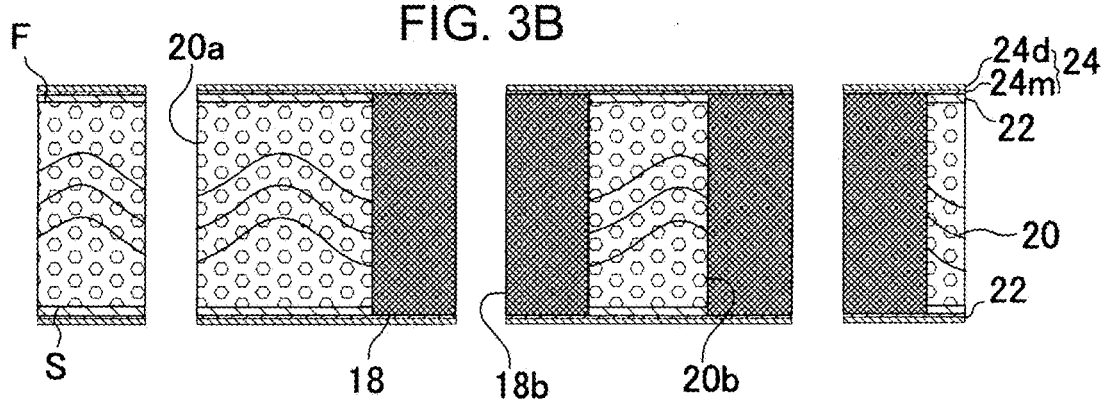
Figure 3C:
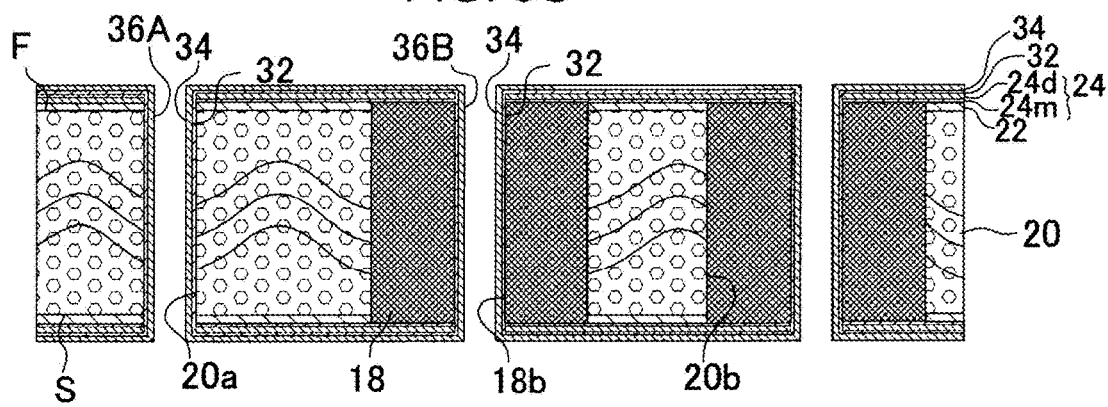

The second through holes (18b) are formed in the temporarily cured magnetic resin (18β) by mechanical drilling, laser processing, or the like. In this embodiment, since the second through holes (18b) are formed before the magnetic resin (18β) is fully cured, the through holes can be easily formed. Then, the second through holes (18b) are formed such that the cut end surfaces of the iron oxide filler particles are exposed by adjusting conditions of mechanical drilling and laser processing such that the iron oxide filler particles do not fall off from the surfaces of the second through holes (18b). The magnetic material layer in a temporarily cured state is heated to cause the resin contained therein to crosslink, and thereby, the magnetic material layer is fully cured to form the magnetic resin 18 (FIG. 3A). Here, the heating is performed at 150° C.-190° C. for 1 hour. By high-pressure water washing, processing smear occurred during through hole formation is removed (FIG. 3B). Desmearing may be performed using an alkaline agent. However, there is a risk that an alkaline agent may cause the iron oxide filler contained in the magnetic resin 18 to fall off during a process in which the resin is swelled and peeled off. Therefore, here, high-pressure water washing is performed. As a result, the surface roughness of the second through holes (18b) is reduced. On the first electrolytic plating film (24d) on the surfaces of the insulating base material 20 and the magnetic resin 18 and on surfaces of the first through holes (20a) and the second through holes (18b), a second electroless plating film 32 is formed by an electroless plating treatment and a second electrolytic plating film 34 is formed by an electrolytic plating treatment. By the second electroless plating film 32 and the second electrolytic plating film 34, the first through-hole conductors (36A) are formed in the first through holes (20a) and the second through-hole conductors (36B) are formed in the second through holes (18b) (FIG. 3C).

Figure 3D:
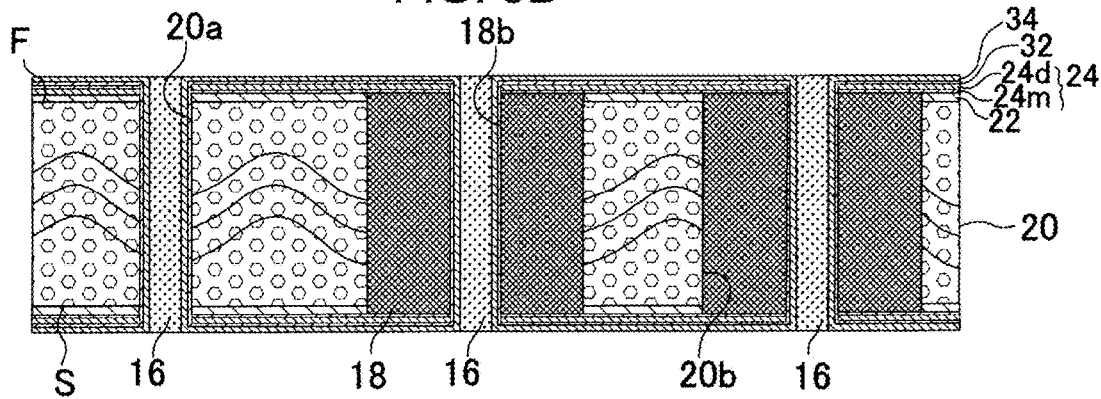
Figure 4A:
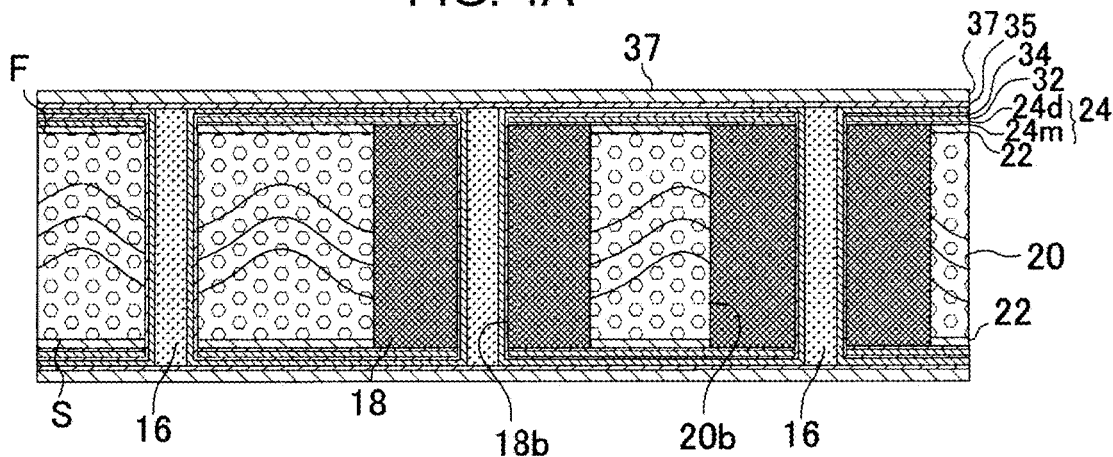
FIGS. 4A-4C are process diagrams illustrating the method for manufacturing an inductor built-in substrate according to the embodiment of the present invention.
Figure 4B:
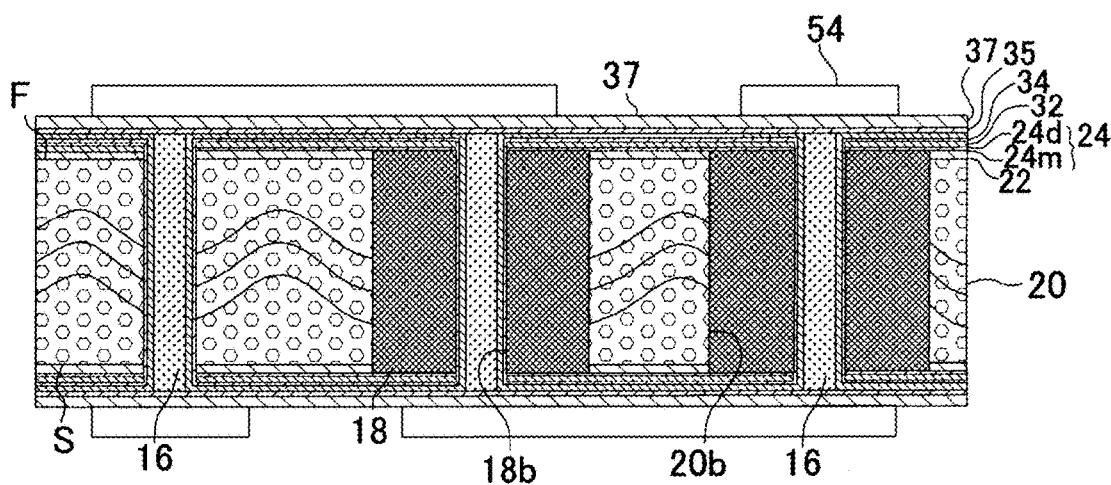

The resin filler 16 is filled inside the first through-hole conductors (36A) formed in the first through holes (20a) and inside the second through-hole conductors (36B) formed in the second through holes (18b), and the surfaces of the core substrate 30 are polished (FIG. 3D). A third electroless plating film 35 is formed by electroless plating on the second electrolytic plating film 34 and on exposed surfaces of the resin filler 16, and a third electrolytic plating film 37 is formed on the third electroless plating film 35 (FIG. 4A). An etching resist 54 of a predetermined pattern is formed on the third electrolytic plating film 37 (FIG. 4B).

Figure 4C:
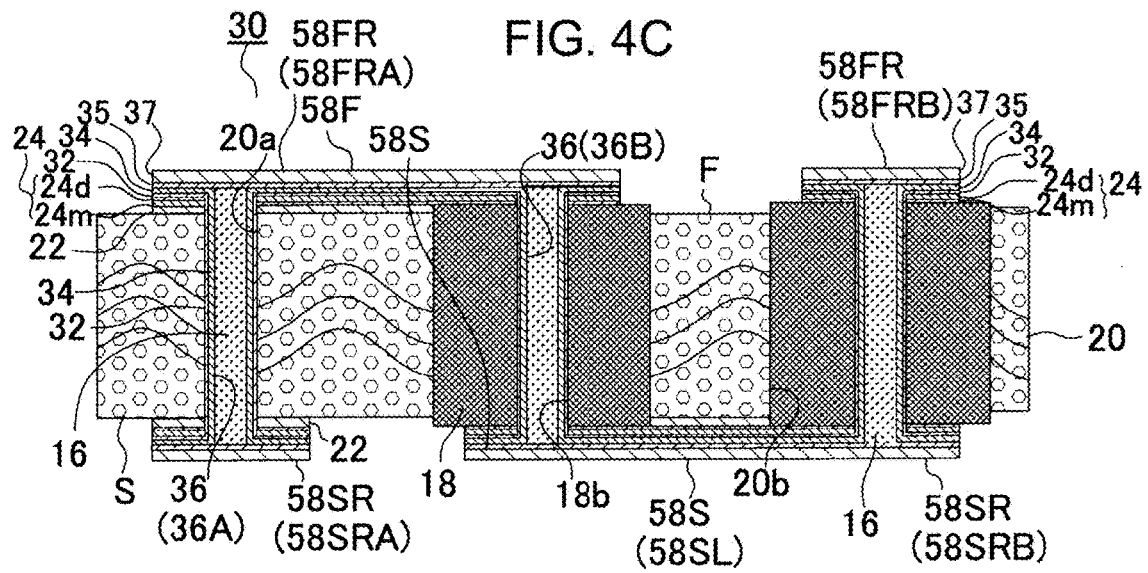

The third electrolytic plating film 37, the third electroless plating film 35, the second electrolytic plating film 34, the second electroless plating film 32, the first electrolytic plating film (24d), the first electroless plating film (24m), and the copper foil 22 exposed from the etching resist 54 are removed, and thereafter, the etching resist is removed, and the first conductor layer (58F), the second conductor layer (58S) are formed and the core substrate 30 is completed (FIG. 4C).

The upper side build-up layer (450F), the lower side build-up layer (450S), the solder resist layers (470F, 470S), and the solder bumps (476F, 476S) are formed on the core substrate 30 using known manufacturing methods (FIG. 1A).

In Japanese Patent Application Laid-Open Publication No. 2016-197624, since the through-hole conductors are formed in the resin layer, it is thought that a ratio of the magnetic material with respect to a size of the inductor component is low and it is difficult to increase an inductance.

An inductor built-in substrate according to an embodiment of the present invention has a low power loss in through-hole conductors formed in a magnetic resin.

An inductor built-in substrate according to an embodiment of the present invention includes: a core substrate in which an opening and a first through hole are formed; a magnetic resin that is filled in the opening and has a second through hole; a first through-hole conductor that is formed of a metal film formed in the first through hole; and a second through-hole conductor that is formed of a metal film formed in the second through hole. A surface of the first through hole has a larger roughness than a surface of the second through hole.

In an inductor built-in substrate according to an embodiment of the present invention, the second through-hole conductor formed of a metal film is directly formed in the second through hole of the magnetic resin. Therefore, a volume of the magnetic resin of an inductor component can be increased, and an inductance can be increased. The surface roughness of the first through hole formed in the core substrate is larger than the surface roughness of the second through hole formed in the magnetic resin. Since the surface roughness of the second through hole is low, surface unevenness of the second through-hole conductor formed on the surface of the second through hole is reduced, and a power loss in the second through-hole conductor is reduced.

Obviously, numerous modifications and variations of the present invention are possible in light of the above teachings. It is therefore to be understood that within the scope of the appended claims, the invention may be practiced otherwise than as specifically described herein.

What is claimed is:

1. An inductor built-in substrate, comprising:
 a core substrate having an opening and a first through hole formed therein;
 a magnetic resin filling the opening and having a second through hole formed therein;

a first through-hole conductor comprising a metal film formed in the first through hole; and a second through-hole conductor comprising a metal film formed in the second through hole, wherein the core substrate and the magnetic resin are formed such that a surface in the first through hole has a roughness that is larger than a roughness of a surface in the second through hole.

2. The inductor built-in substrate according to claim 1, wherein the core substrate is a resin substrate having a core material.

3. The inductor built-in substrate according to claim 1, wherein the magnetic resin includes iron oxide filler in an amount of 60% by weight or more.

4. The inductor built-in substrate according to claim 3, wherein the iron oxide filler is in a form of particles such that cut end surfaces of the particles are exposed on the surface of the second through hole.

5. The inductor built-in substrate according to claim 1, wherein the core substrate is formed such that the surface of the first through hole has a ten-point average roughness Rz in a range of 2.3 to 12.3 μm, and the magnetic resin is formed such that the surface of the second through hole has a ten-point average roughness Rz in a range of 0.1 to 2.2 μm.

6. The inductor built-in substrate according to claim 1, further comprising:

a plurality of conductor layers formed on sides of the core substrate respectively such that the conductor layers and the second through-hole conductor form a helical inductor.

7. The inductor built-in substrate according to claim 2, wherein the magnetic resin includes iron oxide filler in an amount of 60% by weight or more.

8. The inductor built-in substrate according to claim 7, wherein the iron oxide filler is in a form of particles such that cut end surfaces of the particles are exposed on the surface of the second through hole.

9. The inductor built-in substrate according to claim 2, wherein the core substrate is formed such that the surface of the first through hole has a ten-point average roughness Rz in a range of 2.3 to 12.3 μm, and the magnetic resin is formed such that the surface of the second through hole has a ten-point average roughness Rz in a range of 0.1 to 2.2 μm.

10. The inductor built-in substrate according to claim 2, further comprising:

a plurality of conductor layers formed on sides of the core substrate respectively such that the conductor layers and the second through-hole conductor form a helical inductor.

11. The inductor built-in substrate according to claim 3, wherein the core substrate is formed such that the surface of the first through hole has a ten-point average roughness Rz in a range of 2.3 to 12.3 μm, and the magnetic resin is formed such that the surface of the second through hole has a ten-point average roughness Rz in a range of 0.1 to 2.2 μm.

12. The inductor built-in substrate according to claim 3, further comprising:

a plurality of conductor layers formed on sides of the core substrate respectively such that the conductor layers and the second through-hole conductor form a helical inductor.

13. The inductor built-in substrate according to claim 4, wherein the core substrate is formed such that the surface of the first through hole has a ten-point average roughness Rz in a range of 2.3 to 12.3 μm, and the magnetic resin is formed such that the surface of the second through hole has a ten-point average roughness Rz in a range of 0.1 to 2.2 μm.

14. The inductor built-in substrate according to claim 4, further comprising:

a plurality of conductor layers formed on sides of the core substrate respectively such that the conductor layers and the second through-hole conductor form a helical inductor.

15. The inductor built-in substrate according to claim 5, further comprising:

a plurality of conductor layers formed on sides of the core substrate respectively such that the conductor layers and the second through-hole conductor form a helical inductor.

16. The inductor built-in substrate according to claim 9, further comprising:

a plurality of conductor layers formed on sides of the core substrate respectively such that the conductor layers and the second through-hole conductor form a helical inductor.

17. The inductor built-in substrate according to claim 11, further comprising:

a plurality of conductor layers formed on sides of the core substrate respectively such that the conductor layers and the second through-hole conductor form a helical inductor.

18. The inductor built-in substrate according to claim 7, wherein the core substrate is formed such that the surface of the first through hole has a ten-point average roughness Rz in a range of 2.3 to 12.3 μm, and the magnetic resin is formed such that the surface of the second through hole has a ten-point average roughness Rz in a range of 0.1 to 2.2 μm.

19. The inductor built-in substrate according to claim 7, further comprising:

a plurality of conductor layers formed on sides of the core substrate respectively such that the conductor layers and the second through-hole conductor form a helical inductor.

20. The inductor built-in substrate according to claim 8, wherein the core substrate is formed such that the surface of the first through hole has a ten-point average roughness Rz in a range of 2.3 to 12.3 μm, and the magnetic resin is formed such that the surface of the second through hole has a ten-point average roughness Rz in a range of 0.1 to 2.2 μm.

* * * * *